(12) United States Patent
Powers

(10) Patent No.: US 7,068,347 B2
(45) Date of Patent: Jun. 27, 2006

(54) APPARATUS FOR REDUCING PELLICLE DARKENING

(75) Inventor: James M. Powers, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/327,251

(22) Filed: Dec. 20, 2002

(65) Prior Publication Data

US 2004/0119965 A1 Jun. 24, 2004

(51) Int. Cl.
G03B 27/52 (2006.01)
G03B 27/42 (2006.01)
G03B 27/62 (2006.01)
G03F 1/00 (2006.01)

(52) U.S. Cl. .................. 355/30; 355/53; 355/75; 430/5

(58) Field of Classification Search .............. 355/53, 355/75, 30, 77; 430/5
See application file for complete search history.

(56) References Cited

U.S. PATENT DOCUMENTS

| | | | | |
|---|---|---|---|---|
| 5,394,219 A | * | 2/1995 | Hirosue | 355/77 |
| 5,422,704 A | * | 6/1995 | Sego | 355/53 |
| 5,453,816 A | * | 9/1995 | Wang | 355/75 |
| 5,793,836 A | * | 8/1998 | Maldonado et al. | 378/35 |
| 6,340,541 B1 | * | 1/2002 | Yoo | 430/5 |
| 6,507,390 B1 | * | 1/2003 | Ivaldi | 355/75 |
| 2001/0038950 A1 | * | 11/2001 | Chiba et al. | 430/5 |
| 2002/0085183 A1 | * | 7/2002 | Wu et al. | 355/30 |
| 2003/0117609 A1 | * | 6/2003 | Kamono | 355/75 |
| 2003/0197851 A1 | * | 10/2003 | Aoyama | 355/75 |
| 2003/0227605 A1 | * | 12/2003 | del Puerto et al. | 355/51 |

FOREIGN PATENT DOCUMENTS

JP 09-197652 * 7/1997

* cited by examiner

Primary Examiner—Alan Mathews
(74) Attorney, Agent, or Firm—Erik M. Metzger

(57) ABSTRACT

Pellicles separated by a distance sufficient to allow a purge gas help repair damage to at least one of the pellicles caused by exposure to an incident radiation and allowing at least a minimum amount of radiation to reach a semiconductor wafer sufficient to perform a desired photolythography process. Moreover, the two pellicles separated by a sufficient distance such that a dispersed purge gas dispersed between the pellicles will not absorb more than an amount of energy from the incident radiation so as to prevent a desired amount of the radiation to reach a semiconductor wafer located a certain distance away from the pellicles.

21 Claims, 3 Drawing Sheets

APPARATUS FOR REDUCING PELLICLE DARKENING

Embodiments of the invention relate to semiconductor processing. More specifically, embodiments of the invention relate to extending the life of pellicles used in conjunction with incident light during photolithography without significantly degrading the energy of the incident light.

BACKGROUND

As photolithography in modern semiconductor processing requires higher frequency (shorter wavelength) light in order to create smaller device dimensions within semiconductor devices, harmful effects to the photolithography equipment involved in the processing may result. One such harmful effect occurs when fluoropolymer pellicles are exposed to the high-frequency (high energy) light. Specifically, fluoropolymer pellicles are vulnerable to photochemical darkening when exposed to high-frequency light, which can result in the pellicles having to be replaced more frequently.

One reason for the premature darkening of fluoropolymer pellicles is the destruction of chemical bonds within the fluoropolymer pellicles resulting from the energy transferred from the incident high-frequency light to the pellicles. The darkening caused by the breaking of chemical bonds within the pellicles by the incident high-frequency light reduces the transmission of the light to the underlying semiconductor structure to be exposed to the light.

FIG. 1 illustrates a prior art photolithography system in which a reticle package containing a fluoropolymer pellicle is exposed to high-frequency light transmitted through the mask, then projected unto the wafer. Existing reticle packages typically attempt to reduce the effects of the high-frequency light on the pellicle by producing pellicles that are more transparent and therefore less likely to react with the incident light. Because it is difficult to produce a pellicle that is truly transparent, some photons from the incident light are still absorbed, resulting in a degradation of the pellicle's transparency and lifespan.

FIG. 1 further illustrates the use of $N_2$ purging in order to dispel photon-absorbing compounds, such as $O_2$ and $H_2O$ found in the atmosphere surrounding the pellicle.

Exposure of pellicles to a combination of $O_2$ and $N_2$ has been shown to decrease the destructive effects of high-frequency incident radiation without substantially attenuating the intensity of the radiation when used in proper amounts. Furthermore, other purge gas mixtures, such as $H_2/N_2$, $F_2/N_2$, and $F_2/H_2/N_2$, as well as fluorocarbon gases, such as $CF_4$, and $C_2F_6$, or a mixture of $O_2$ with these gases can be used as a suitable purge gas to help extend the transparency life of pellicles. Other fluorocarbon (FC) gases or hydrofluorocarbon (HFC) gases may also be used as purging gases.

Excessive amounts of these purge gases, however, can attenuate the intensity of an incident radiation, thereby altering the intended effect upon device features of the semiconductor. For example, exposing an entire reticle to these purge gases could decrease the destructive effects by the incident radiation to the pellicle of FIG. 1, but would attenuate the incident radiation intensity such that the light would not properly react with the exposed silicon features on the wafer.

BRIEF DESCRIPTION OF THE DRAWINGS

Embodiments and the invention are illustrated by way of example and not limitation in the figures of the accompanying drawings, in which like references indicate similar elements and in which.

DETAILED DESCRIPTION

Embodiments of the invention described herein pertain to a structure and technique for performing photolithography on a semiconductor wafer using high-frequency radiation while substantially preserving the optical quality of the pellicle through which the radiation passes. More particularly, embodiments of the invention involve quenching a pellicle or pellicles in a purge gas in order to help prevent darkening of the pellicle, thereby extending the lifetime of the pellicle(s).

Figure 1:
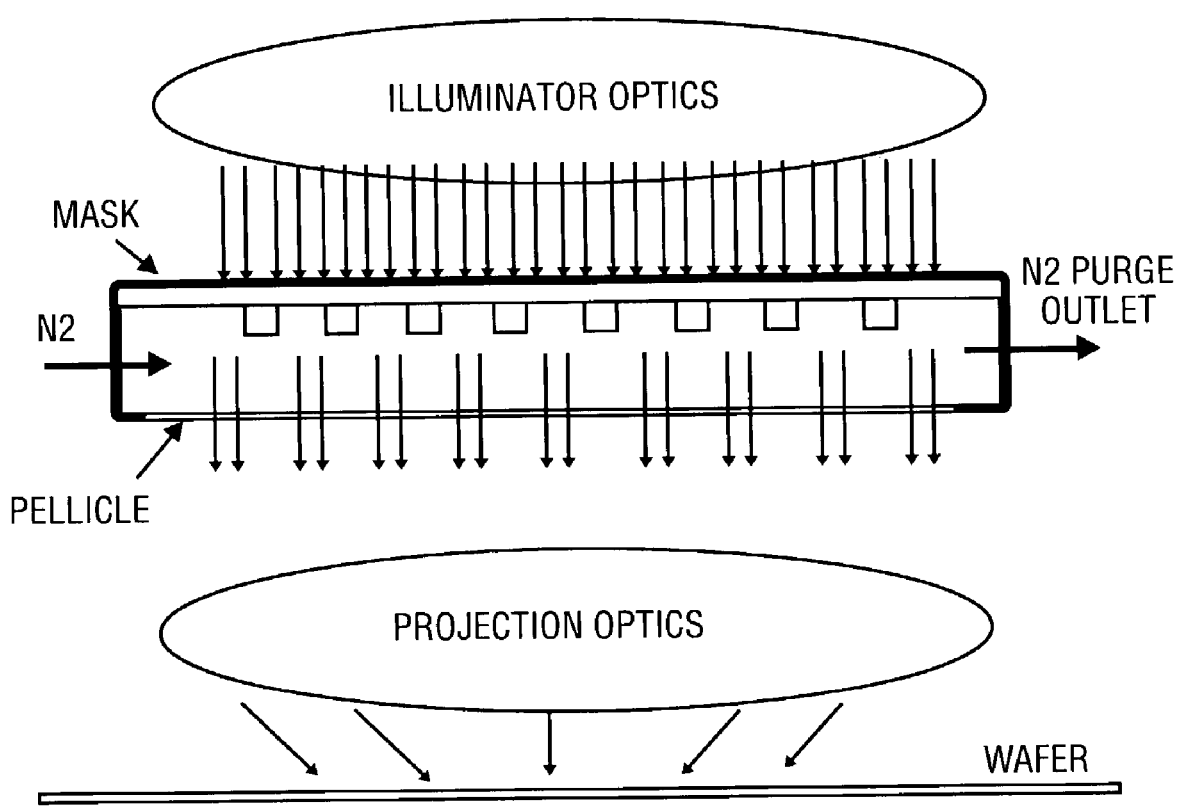
FIG. 1 is a prior art stepper system employing a reticle with one pellicle.
Figure 2:
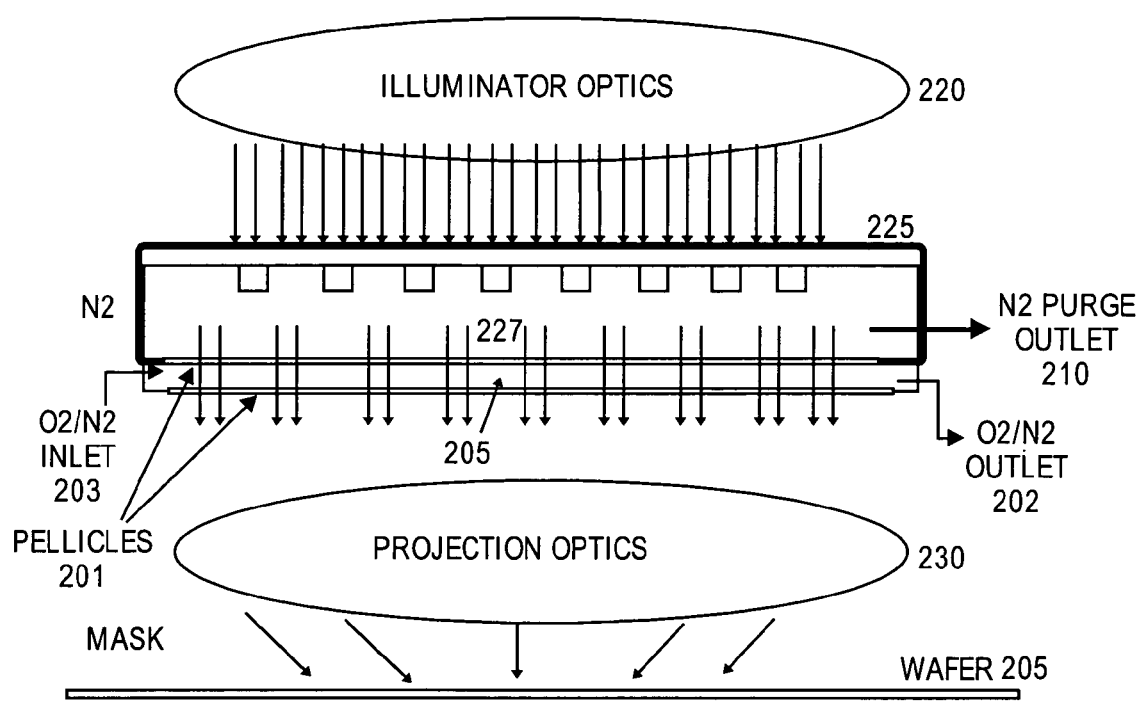
FIG. 2 is a reticle according to one embodiment of the invention that employs two pellicles separated by a gap through which a purge gas may flow.

FIG. 2 illustrates a reticle according to one embodiment of the invention that uses two pellicles 201 separated by a gap 205 through which a purge gas 210 may be dispersed. In the embodiment of the invention illustrated in FIG. 2, a reticle package contains two pellicles by a relatively small gap in order to allow the a purge gas to be introduced into the space between the pellicles and the purge gas inlet 203 and outlet 202, without allowing too much gas so as to overly attenuate the energy of the incident radiation.

In FIG. 2, incident radiation (light) is applied through the illuminator optics 220, the mask layer 225, through the $O_2/N_2$ purge gas, and then through the pellicle. The portion of the incident light that is not blocked by the mask layer 227 passes through the projection optics 230 where it is projected onto the particular features on the wafer to be exposed to the light.

In the embodiment of the invention illustrated in FIG. 2, the purge gas is a combination of $O_2$ and $N_2$. Other gases, however, may be used, including various combinations of $H_2/N_2$, $F_2/N_2$, $F_2$, $H_2$, and $N_2$, as well as fluorocarbon or hydroflourocarbon gases, such as $CF_4$ and $C_2F_6$, or a mixture of $O_2$ with these gases can be used as a suitable purge gas to help extend the transparency life of pellicles.

The radiation used in FIG. 2 is 157 nm in wavelength. Embodiments of the invention, however, may be used in conjunction with radiation of other wavelengths, including 193 nm and 248 nm. Furthermore, other photolithography technologies can be supported in embodiments of the invention, including I-line and immersion lithography.

The pellicles of FIG. 2 are separated by approximately 1 mm. The pellicles, however, may be separated by any distance that is consistent with the amount of energy from the incident radiation necessary to be transmitted to the wafer and the light-absorbing properties of the purge gas used.

For example, the pellicles of FIG. 2 are separated by a distance (~1 mm) such that the $O_2$ does not absorb more energy from the light than is desired. Because $O_2$ strongly absorbs energy from the incident light, the distance between the pellicles should be relatively small, so as to provide the desired energy to the wafer. However, if other purge gases are used that absorb light less strongly than $O_2$, the distance between the pellicles may be greater in order to accommodate more of the purge gas between the pellicles. The distance between the pellicles, therefore, depends at least in part on the frequency (and therefore the energy) of the light used as well as the energy absorbency of the purge gas.

Figure 3:
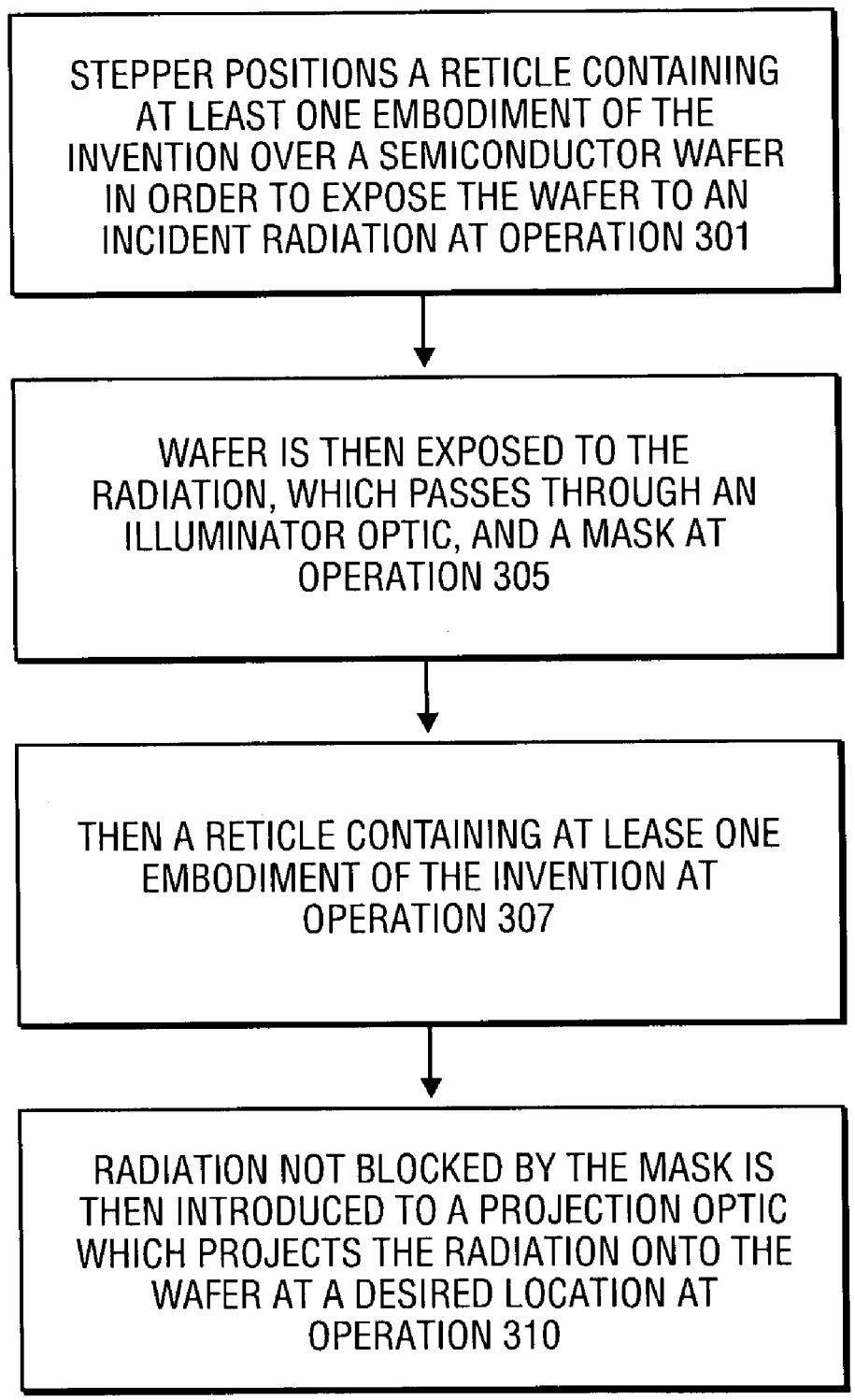
FIG. 3 is a flow diagram illustrating the use of at least one embodiment of the invention.

FIG. 3 is a flow diagram illustrating a use of one embodiment of the invention. A stepper positions a reticle containing at least one embodiment of the invention over a semiconductor wafer in order to expose the wafer to an incident radiation at operation 301. The wafer is then exposed to the radiation, which passes through an illuminator optic, and a mask at operation 305, then a reticle containing at least one embodiment of the invention at operation 307. The radiation not blocked by the mask is then introduced to a projection optic which projects the radiation onto the wafer at a desired location at operation 310.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. An apparatus comprising:
   a first pellicle;
   a second pellicle parallel to the first pellicle;
   a purge gas dispersed between the first and second pellicles to protect areas of at least one of the first and second pellicles from damage resulting from being exposed to an incident light.

2. The apparatus of claim 1 wherein the first and second pellicles are positioned at opposite sides of a space through which the incident radiation may pass.

3. The apparatus of claim 1 wherein the purge gas reduces a rate at which at least one of the first and second pellicles is darkened by exposure to the incident radiation.

4. The apparatus of claim 1 wherein the purge gas has an energy absorbency sufficient to allow a desired amount of energy of the incident radiation to reach a semiconductor wafer located a first distance from one of the first and second pellicles.

5. The apparatus of claim 1 further comprising an illuminator optic through which the incident radiation may pass before passing through the first and second pellicles.

6. The apparatus of claim 5 further comprising a mask through which the incident radiation may pass before passing through the first and second pellicles.

7. The apparatus of claim 6 further comprising a projection optic to project a portion of the incident radiation not blocked by the mask onto a semiconductor wafer.

8. The apparatus of claim 1 wherein the purge gas is chosen from a group consisting of $N_2/O_2$, $H_2/N_2$, $F_2/N_2$, $F_2$, $H_2/N_2$, $CF_4$, $C_2F_6$.

9. The apparatus of claim 2 wherein the first and second pellicles are separated by approximately 1 mm.

10. An apparatus comprising:
    first means for protecting a semiconductor mask from contaminates and for allowing a second portion of incident radiation to reach the semiconductor mask;
    second means for helping to prevent damage to the first means caused by a first portion of the incident radiation by passing through the first means.

11. The apparatus of claim 10 wherein the first means comprises a plurality of pellicles between which the second means is dispersed.

12. The apparatus of claim 11 wherein at least two of the plurality of pellicles are separated by a distance sufficient to contain a first amount of the second means.

13. The apparatus of claim 12 wherein the second means is a purge gas chosen from a group consisting of N2/O2, $H_2/N_2$, $F_2/N_2$, $F_2$, $H_2/N_2$, $CF_4$, $C_2F_6$.

14. The apparatus of claim 13 wherein the purge gas comprises a combination of $O_2$ and any member of the group of claim 21.

15. The apparatus of claim 14 wherein the distance is inversely proportional to the second portion of the incident radiation.

16. The apparatus of claim 15 wherein the first amount of the purge gas is proportional to the distance.

17. The apparatus of claim 10 wherein the first amount of the purge gas is sufficient to ensure that the first portion of the incident radiation is substantially equal to the second portion of the incident radiation.

18. A method comprising:
    positioning a reticle above a semiconductor wafer;
    exposing the semiconductor wafer to an incident radiation, which passes through two pellicles separated by a distance within which a purge gas comprising $O_2$ is dispersed.
    protecting areas of at least one of the two pellicles from damage resulting from being exposed to the incident radiation.

19. The method of claim 18 wherein the purge gas further comprises a gas chosen from a group consisting of $N_2$, $H_2/N_2$, $F_2/N_2$, $F_2$, $H_2/N_2$, $CF_4$, $C_2F_6$.

20. The method of claim 18 wherein the incident radiation has a wavelength chosen from a group consisting of approximately 157 nm, approximately 193 nm, and approximately 248 nm.

21. The method of claim 18 comprising a photolithography process.

* * * * *